United States Patent
Koike et al.

(10) Patent No.: US 8,008,195 B2
(45) Date of Patent: Aug. 30, 2011

(54) METHOD FOR MANUFACTURING SEMICONDUCTOR DEVICE

(75) Inventors: Osamu Koike, Tokyo (JP); Yutaka Kadogawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 41 days.

(21) Appl. No.: 12/656,267

(22) Filed: Jan. 22, 2010

(65) Prior Publication Data

US 2010/0190338 A1    Jul. 29, 2010

(30) Foreign Application Priority Data

Jan. 23, 2009 (JP) ................................. 2009-012586

(51) Int. Cl.
*H01L 21/3205* (2006.01)
(52) U.S. Cl. ............... 438/667; 257/698; 257/E21.597
(58) Field of Classification Search .................. 438/667; 257/698, E21.597
See application file for complete search history.

(56) References Cited

U.S. PATENT DOCUMENTS

| 7,790,503 | B2 * | 9/2010 | Lin et al. | 438/107 |
| 7,858,441 | B2 * | 12/2010 | Lin et al. | 438/109 |
| 7,885,120 | B2 * | 2/2011 | Hung et al. | 365/185.22 |
| 2006/0057836 | A1 * | 3/2006 | Nagarajan et al. | 438/622 |
| 2009/0134497 | A1 * | 5/2009 | Barth et al. | 257/621 |
| 2010/0190338 | A1 * | 7/2010 | Koike et al. | 438/667 |
| 2010/0246152 | A1 * | 9/2010 | Lin et al. | 361/783 |
| 2010/0327383 | A1 * | 12/2010 | Hayasaki et al. | 257/432 |
| 2011/0073987 | A1 * | 3/2011 | Mackh et al. | 257/531 |

FOREIGN PATENT DOCUMENTS

| JP | 2002-083949 A | 3/2002 |
| JP | 2005-235858 A | 9/2005 |
| JP | 2008-140819 A | 6/2008 |
| JP | 2010-0171220 | * 8/2010 |

* cited by examiner

*Primary Examiner* — Mary Wilczewski
(74) *Attorney, Agent, or Firm* — Rabin & Berdo, PC

(57) ABSTRACT

An insulator layer is formed on a part of semiconductor substrate to form an isolation layer that insulates and separates active elements from each other in the first region, and to form a dummy portion which is composed of a base material of the semiconductor substrate exposed in the insulator layer in a second region. Active elements are formed in the first region. A silicide layer is formed on the first and second regions excluding at least a portion in which the TSV electrode should be formed. At least one TSV hole extending from a reverse surface side of the semiconductor substrate to an electrode pad via the second region is formed. A conductive film is formed on the inner wall of the TSV hole to form a TSV electrode electrically connected to the electrode pad.

6 Claims, 12 Drawing Sheets

METHOD FOR MANUFACTURING SEMICONDUCTOR DEVICE

BACKGROUND OF THE INVENTION

1. Field of the Invention

The present invention relates to a semiconductor device and more particularly to a W-CSP semiconductor device having a Through Silicon VIA (TSV) electrode structure.

2. Description of the Related Art

In recent years, a remarkable progress in terms of miniaturization and increase in density and functionality has been achieved in the field of information devices such as digital cameras and cellular phones equipped with cameras. A wafer-level chip size package (hereinafter referred to as W-CSP) that realizes a package of a chip size is known as a technique for miniaturizing image sensors such as CCD sensors and CMOS sensors installed at the aforementioned devices. The W-CSP is a new concept package in which the entire assembly process is completed in a wafer state.

A Through Silicon VIA electrode (hereinafter, referred to as "TSV electrode") structure has been used in an image sensors of a W-CSP structure because reliability can be improved and the device can be miniaturized. An electrode for exchanging signals between a semiconductor device and an external device is usually formed on the same plane as a semiconductor elements formation plane. By contrast, in case of a TSV electrode, a Through Silicon VIA hole (hereinafter, referred to as "TSV hole") is formed in the thickness direction of the chip by etching from the reverse side of the chip using a fine processing technology, a conductive wiring is formed inside the TSV hole so as to connect to a top surface electrode pad, thereby making it possible to exchange signals from the reverse surface of the chip that is usually not used. By stacking a plurality of chips using a TSV electrode technique and forming a signal transmission path in the thickness direction of the chips, it is possible to shorten the wiring length in comparison with that of the conventional wiring. Therefore, packaging density can be dramatically improved and operating speed and reliability of the device can be increased.

Japanese Patent Applications Laid-open Nos. 2005-235858 and 2008-140819 disclose CSP structures having a TSV electrode, and Japanese Patent Application Laid-open No. 2002-83949 discloses a CMOS image sensor structure.

For example, a CMOS sensor is a type of image sensor that converts an electric charge accumulated in a photodiode into a voltage at respective pixels, amplifies the voltage, and then reads the voltage. A CMOS sensor is provided with a photodiode and a cell amplifier in a unit cell. A CMOS sensor is constituted by a plurality of active elements that constitute a photodiode and a cell amplifier, and an STI (Shallow Trench Isolation) is formed for insulating and separating the active elements from each other. Here, a region for forming active elements such as transistors and diodes on a semiconductor substrate is called an active area. A region other than the active area is called a non-active area. In other words, an element separation region such as STI belongs to the non-active area. In the process of forming an STI on a semiconductor substrate, planarization by CMP (Chemical Mechanical Polishing) is performed. When a surface area of an STI region increases, a dishing occurs due to a difference in polishing rates between an oxide film constituting the STI and a nitride film provided as a stopper during polishing. Namely, a dish-like concavity appears in a central portion of the STI. When a dishing occurs, planarity of the substrate is degraded and subsequent processing is therefore made difficult. A dummy pattern having a plurality of island-shaped dummy portions is formed in the non-active area that is the dishing occurrence region to prevent the dishing. The dummy pattern is formed by leaving a base material of a semiconductor substrate in island shapes inside the STI region, and is therefore referred to as a "dummy active portion". Dishing can be prevented because a difference in polishing rates in a CMP process is lessened by the uniform formation of dummy active portions in the non-active area (STI region).

By the way, a salicide technology is known as a technique for decreasing a resistance of a gate wiring and a source-drain diffusion layer of a transistor. In a salicide process, compound layers of a high-melting metal (silicide layers) are formed at the same time in both a source-drain diffusion layer and a gate polysilicon layer, thereby reducing a delay caused by a resistance component and realizing a high-speed operation. Because a metal material for forming a silicide layer is usually formed over the entire surface of a wafer to improve productivity, the silicide layer is formed not only in the active area having active elements, but also on the dummy active portions in the non-active area where no active elements are formed.

In an image sensor of a W-CSP structure, a sensor area having a sensor element group formed therein is disposed in the center of the sensor chip, whereas the non-active area is disposed on the outside of the sensor area. Further, in a usual configuration, the TSV electrodes are formed in the non-active area outside the sensor area, and dummy active portions are formed in the non-active area in order to prevent the above-described dishing. Thus, in a process of manufacturing an image sensor of a W-CSP type that uses a salicide technology, the TSV holes that passes through the silicide layer formed on the dummy active portions are formed by a dry etching method. The inventors have discovered that when the TSV hole intersects with the silicide layer in a dry etching process, notches (outwardly expanding depressions in the side wall of the TSV hole) appear in the side wall of the TSV hole. How such notches appear will be explained below in greater detail.

FIG. 1 is a plan view illustrating a surface structure of a semiconductor substrate in the vicinity of a TSV electrode formation portion. A broken line in the figure shows an outer edge of the TSV electrode (TSV hole) that intersects with this plane. A TSV hole 21 that has an almost cylindrical shape is formed within a non-active area 100 in which no active element such as a CMOS sensor is formed. An STI layer 110 composed of a $SiO_2$ film is extended in the non-active area 100, and a plurality of island-shaped dummy active portions 200a are uniformly disposed on the $SiO_2$ film for dishing prevention. In a semiconductor device using the salicide technology, a silicide layer is also formed on the dummy active portions 200a when the silicide layer is formed on the active elements in the active area (not shown in the figure). The TSV hole 21 is formed so as to pass through the non-active area 100 having arranged therein a plurality of dummy active portions 200a having the silicide layer on the surface. When the size and arrangement spacing of the dummy active portions 200a are less than the size of the TSV hole 21, the outer edge of the TSV hole 21 intersects with the dummy active portions 200a.

FIG. 2 is a cross-sectional view along the 2-2 line in FIG. 1. An interlayer insulating film 12 is formed on a semiconductor substrate 10, and an electrode pad 13 electrically connected to a sensor portion is formed in the interlayer insulating film 12. The TSV hole 21 is formed by dry etching from the reverse surface of the semiconductor substrate toward the electrode pad 13. It was found out that when in the dry etching process, the outer edge of the TSV hole 21 intersects with the dummy active portions 200a having silicide layer 210, notches 300, which are a depressed portion of the side wall of the TSV hole 21, appear at the depth position of near the interface between the semiconductor substrate 10 and the interlayer insulating film 12. In FIG. 1, the locations where notches 300 are appeared are shown by hatching. As shown in FIG. 1, it can be found that the notches 300 appear only in the locations where the outer edge of the TSV hole 21 intersects with the dummy actives 200a.

In the process of forming a TSV electrode, the TSV hole 21 is formed and then, a barrier metal, a plating seed film, and a plating film are successively formed on the inner wall of the TSV hole. Cu is generally used as the plating film, but Cu is a typical material of metal contamination for silicon devices. Cu can diffuse to the semiconductor substrate or interlayer insulating film at a comparatively low temperature and degrade the device performance and reliability, for example, by causing a junction leak or insulation breakdown of the interlayer insulating film. Therefore, a barrier metal such as Ti or Ti/Ni is provided between the semiconductor substrate and the Cu film constituting a conductive wiring of the TSV electrode in order to prevent the Cu-diffusion into the semiconductor substrate.

However, when notches appear at the side wall of the TSV hole, it is difficult to form a sufficient barrier metal at the notch appearance portions and there is a risk of causing a lacking portion of the barrier metal in the notch appearance portions. In this case, Cu could diffuse into the semiconductor substrate in the areas where there is insufficient coverage by the barrier metal, and the device performance and reliability are seriously affected.

SUMMARY OF THE INVENTION

The present invention has been contrived in view of the above-described issues, and an object is to provide a method for manufacturing a semiconductor device that includes at least one TSV electrode that passes through a non-active area having dummy active portions and uses a salicide technology, the method making it possible to prevent the appearance of notches at the side wall of the TSV hole constituting the TSV electrode.

The method for manufacturing a semiconductor device in accordance with the present invention is a method for manufacturing a semiconductor device including a semiconductor substrate having a first region that includes a plurality of active elements and a second region that excludes any active elements, at least one electrode pad electrically connected to any of the active elements, and at least one TSV electrode electrically connected to the electrode pad by way of the second region, the method including the steps of: forming an insulator layer on a part of the silicon substrate to form an isolation layer that insulates and separates the active elements from each other in the first region, and to form a dummy portion which is a base material of the silicon substrate exposed in the insulator layer in the second region; forming the active elements in the first region; forming a silicide layer on the first and second regions excluding at least a portion in which the TSV electrode should be formed; forming at least one TSV hole extending from a reverse surface side of the silicon substrate to the electrode pad via the second region; and forming a conductive film on the inner wall of the TSV hole to form the TSV electrode electrically connected to the electrode pad.

With the method for manufacturing a semiconductor device in accordance with the present invention, a salicide block is implemented at least in the non-active area through which a TSV electrode passes and a silicide layer is selectively formed only on the active elements in the sensor area. Therefore, in the dry etching process conducted to form the TSV hole constituting the TSV electrode, charging by the etching ions and curving of the etching ion trajectory caused thereby can be avoided. As a result, the appearance of the notches in the side surface of the TSV hole can be prevented. Therefore, the barrier metal can be formed without causing a lacking portion at the side wall of the TSV hole, and the diffusion of a contaminant such as Cu that is the material of the TSV electrode into the semiconductor substrate can be reliably prevented.

DETAILED DESCRIPTION OF THE INVENTION

Figure 1:
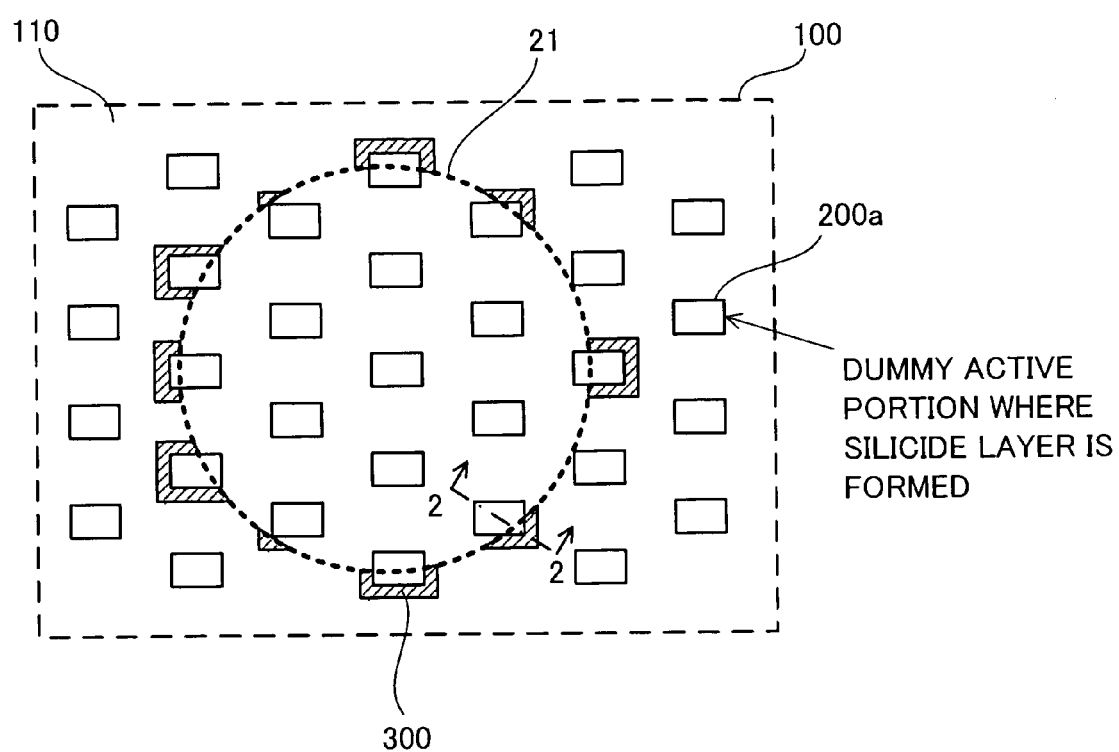
FIG. 1 is a plan view illustrating a surface structure of the semiconductor substrate in the vicinity of a TSV electrode formation portion.
Figure 2:
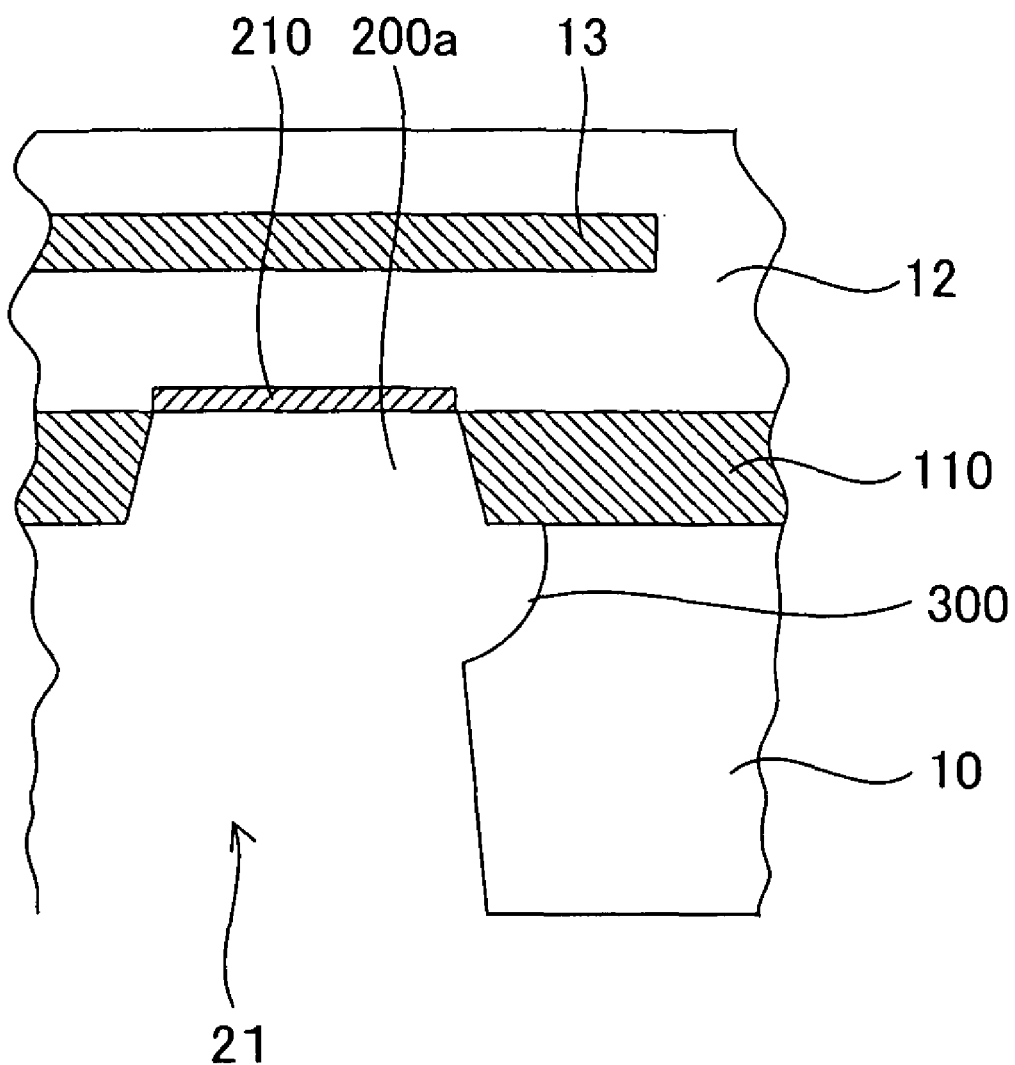
FIG. 2 is a cross-sectional view along the 2-2 line in FIG. 1.
Figure 3:
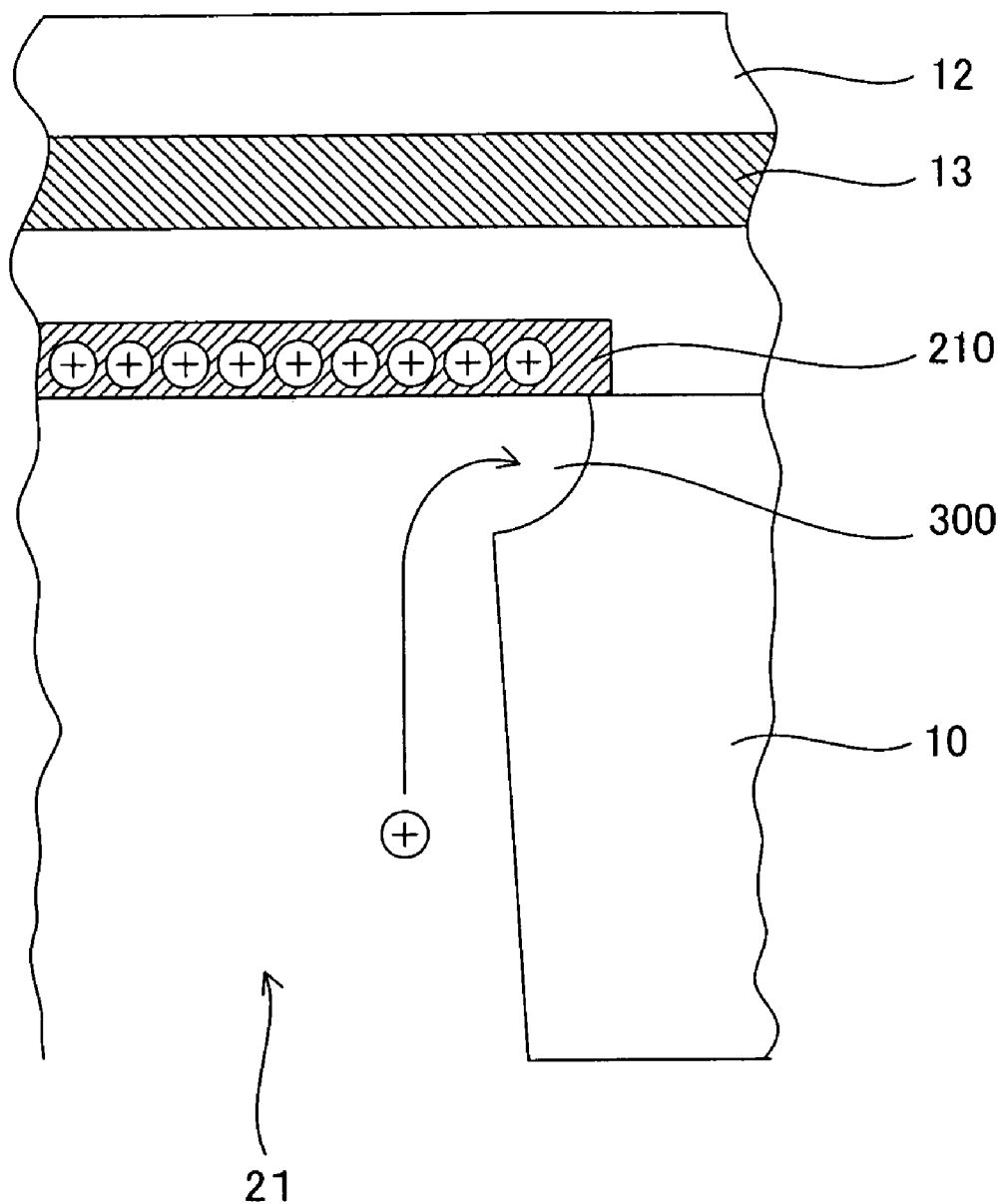
FIG. 3 is a cross-sectional view illustrating a mechanism of notch generation.

Prior to explaining the embodiments of the present invention, a supposed mechanism of notches formation at the side wall of a TSV hole will be explained with reference to FIG. 3.

Usually, in a W-CSP semiconductor device, active elements such as transistors are formed on the surface of the semiconductor substrate 10, a salicide process is implemented, and then TSV holes are formed. In the process of forming the TSV hole, semiconductor substrate 10 is etched from a reverse surface (surface on the side opposite that of the active element formation surface) by using a reactive ion etching (RIE) method and the TSV hole 21 is formed in the semiconductor substrate 10. In the etching process, when the TSV hole 21 reaches the silicide layer 210 formed on the dummy active portions, the silicide layer 210 is electrically charged by the etching ions. As a result, an electrostatic force created by the electric charge of the silicide layer 210 acts upon the irradiated etching ions and the trajectory of the etching ions is curved in the direction toward the side wall of the TSV hole 21. The inventors have supposed that the collision of the etching ions with the side wall of the TSV hole 21 causes the formation of the notches 300 in this portion.

Therefore, in order to prevent the appearance of the notches at the side wall of the TSV hole, it is necessary not to provide the silicide layer, that causes changing the trajectory of etching ions, at least in the vicinity of the portion where the outer edge of the TSV hole passes. In other words, it is necessary to form the silicide layer selectively. In the below-described embodiment of the present invention, the silicide layer is formed selectively in a semiconductor device using the salicide technology. The embodiment of the present invention will be described below with reference to the appended drawings.

Figure 4:
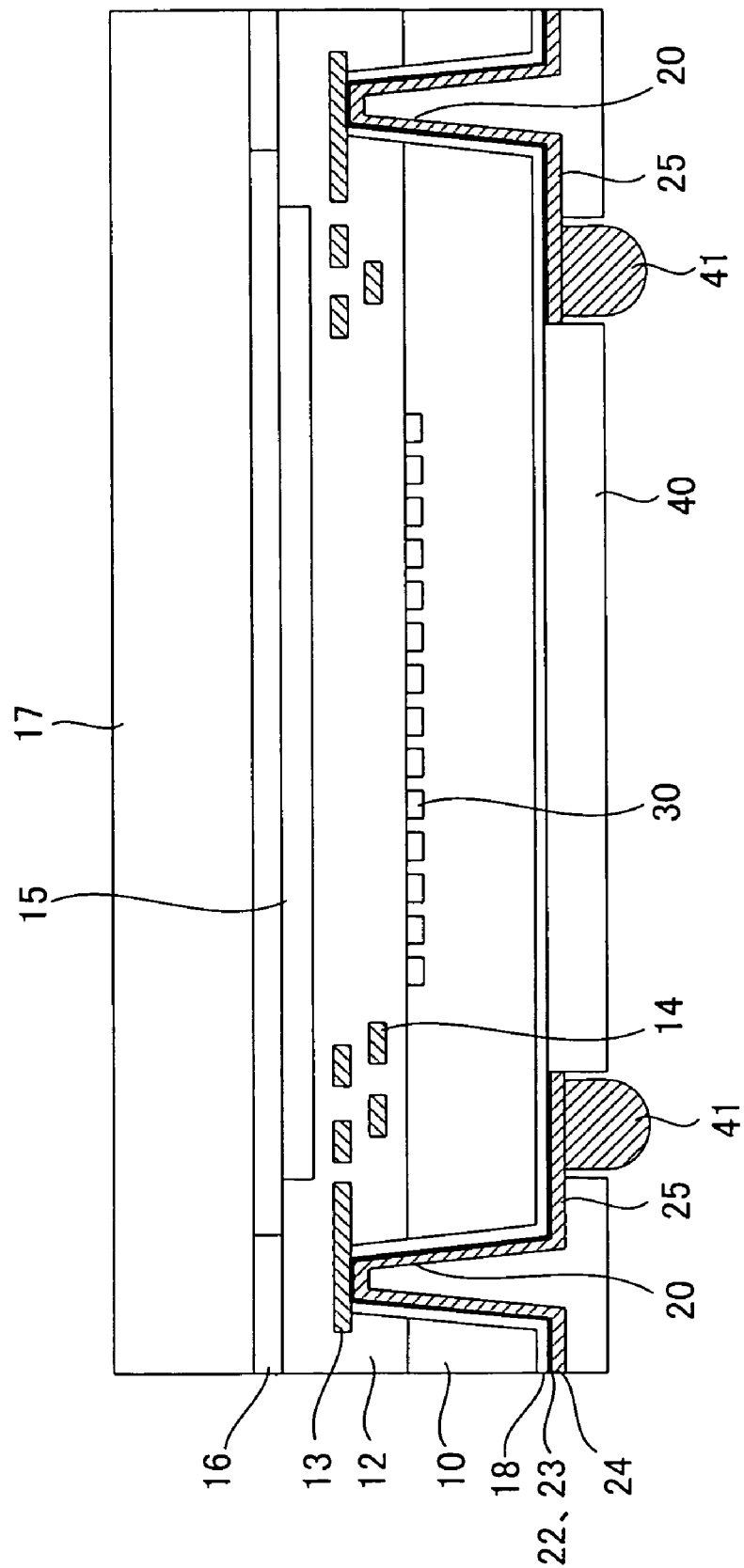
FIG. 4 is a cross-sectional view illustrating a configuration of the image sensor in accordance with an embodiment of the present invention.

FIG. 4 is a cross-sectional view illustrating the configuration of an image sensor in accordance with an embodiment of the present invention. A semiconductor substrate 10 composed of single crystal silicon or the like constitutes the image sensor body, and a plurality of image pickup elements 30 that include CMOS sensors constituting a sensor circuit are formed in the central portion of the substrate surface. Light emitted from the imaging target is converged on a light-receiving surface of the semiconductor substrate 10 by an optical system such as a lens provided on the outside of the image sensor. The image pickup elements 30 output a photoelectric converted signal corresponding to the intensity of the received light as a detection output signal. Image data are then created based on the position of the image pickup elements and the detection output signal.

An interlayer insulating film 12 composed of $SiO_2$ or the like is formed on the surface of the semiconductor substrate 10, and a conductive wiring 14 having a multilayer structure and electrically connected to the image pickup elements 30 is formed inside the interlayer insulating film 12. Further, electrode pads 13 electrically connected to the conductive wiring 14 are also formed inside the interlayer insulating film 12. A color filter 15 for conducting color separation of the received light into three primary colors is provided on the surface of the interlayer insulating film 12. A cover glass 17 is attached to the interlayer insulating film 12 by an adhesive sheet 16.

TSV electrodes 20 that reach from the reverse surface of the semiconductor substrate 10 to the electrode pads 13 located inside the interlayer insulating film 12 are provided in the semiconductor substrate 10. Each of the TSV electrodes 20 is formed by forming a TSV hole and then successively forming a barrier metal 22 composed for example of Ti or Ti/Ni, a plating seed film 23 composed of Cu or the like, and a plated film 24 composed of Cu or the like on the side wall and bottom surface of the TSV hole. These conductive films constituting the TSV electrode 20 are connected to the electrode pad 13 at the bottom surface of the TSV hole and also connected to a reverse surface wiring 25 spread over the reverse surface of the semiconductor substrate 10. Insulation between the conductive film of the TSV electrode 20, the reverse surface wiring 25, and the semiconductor substrate 10 is ensured by an insulating film 18 composed of $SiO_2$ or the like formed along the side wall of the TSV hole and the reverse surface of the semiconductor substrate 10. A solder resist 40 is formed on the reverse surface of the semiconductor substrate 10 so as to be embedded in the TSV holes of the TSV electrodes 20. Openings are formed in the solder resist 40, and reverse surface electrode pads forming a part of the reverse surface wiring 25 are provided in the openings. Solder bumps 41 are provided on each of the reverse surface electrode pads, thereby constituting the external connection terminals that are electrically connected to the electrode pads 13 via the TSV electrodes 20 and reverse surface wiring 25. Thus, the package of the image sensor of the present embodiment has a W-CSP configuration of the same size as the semiconductor substrate 10.

Figure 5:
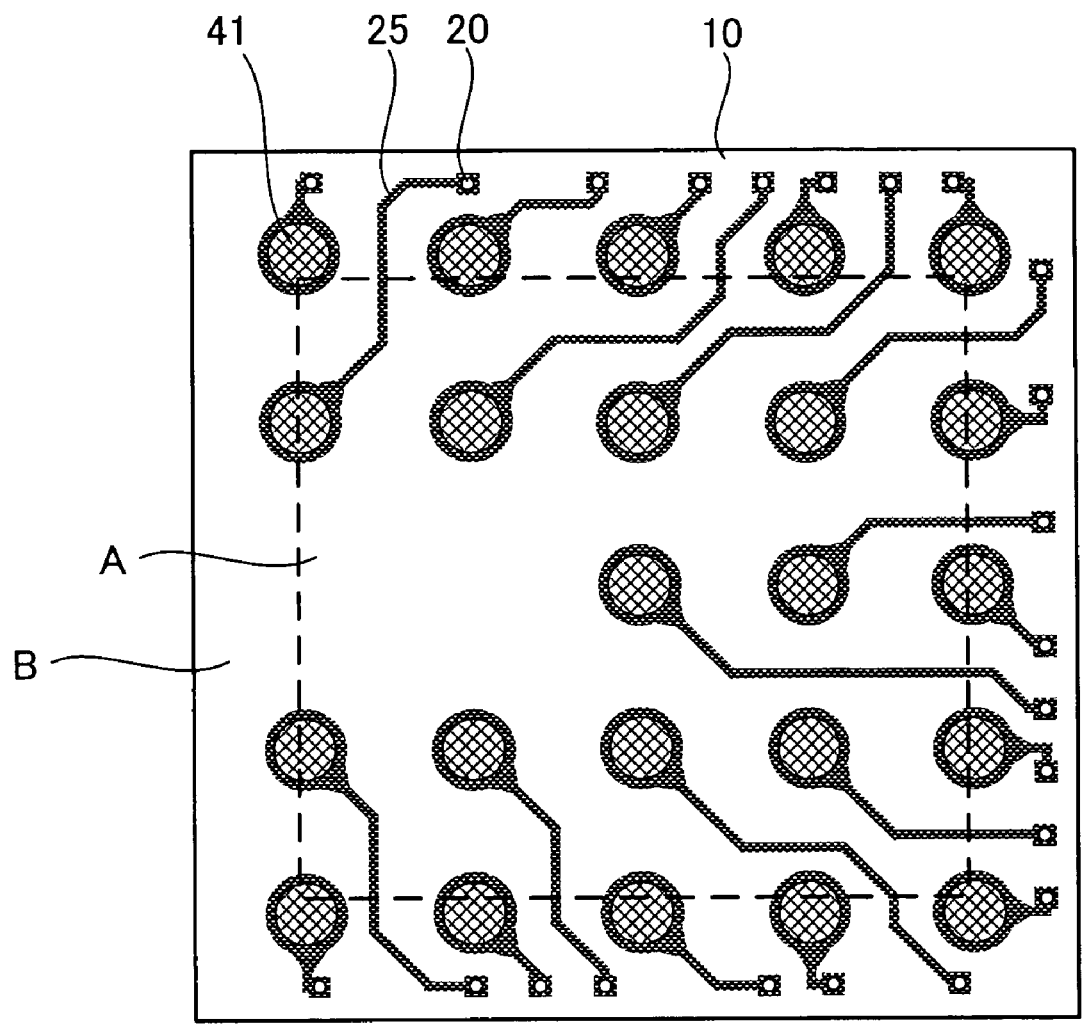
FIG. 5 is a bottom plan view illustrating the reverse surface side of the image sensor in accordance with an embodiment of the present invention.

FIG. 5 is a bottom plan view illustrating the reverse surface side of the semiconductor substrate 10. A plurality of TSV electrodes 20 are formed along the outer edge of the semiconductor substrate 10. The solder bumps 41 are arranged in the grid-like configuration on the reverse surface of the semiconductor substrate 10 and electrically connected to the corresponding TSV electrodes 20 via the reverse surface wiring 25 respectively. The sensor area "A" enclosed by the broken line in the figure and positioned in the center of the semiconductor substrate 10 is an area where an active element group such as CMOS sensors is formed. TSV electrodes 20 are formed in a non-active area "B" where is outside of the sensor area "A".

Figure 6:
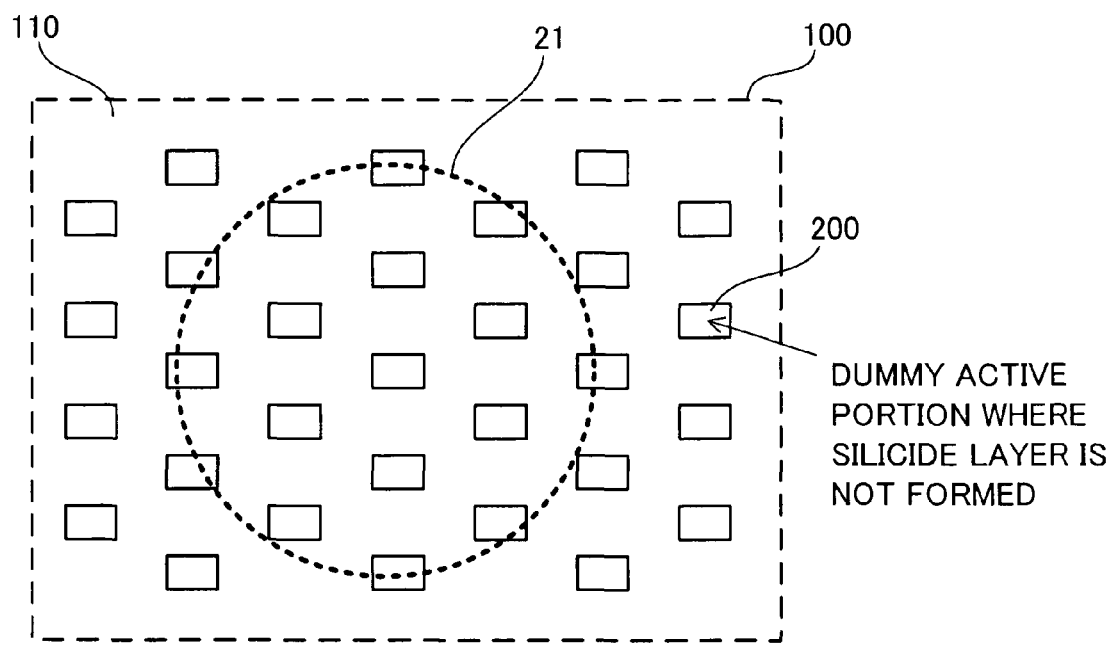
FIG. 6 is a plan view illustrating a surface structure of the semiconductor substrate in the vicinity of the TSV electrode formation portion.

FIG. 6 is a plan view showing a surface structure of the semiconductor substrate 10 in the vicinity of a TSV electrode formation portion that is included in the non-active area "B". A broken line in the figure shows an outer edge of the TSV electrode (TSV hole 21) that intersects with this plane. The TSV hole 21 of almost cylindrical shape constituting the TSV electrode 20 is formed in a non-active area 100 in which no active element such as a CMOS sensor is formed. An STI layer 110 composed of $SiO_2$ or the like extends in the non-active area 100. Because the STI layer 110 has a comparatively large surface area, dishing can occur in the CMP process for forming the STI layer 110. A dummy pattern is formed in the non-active area 100 to prevent the dishing. The dummy pattern is constituted by a plurality of island-shaped dummy active portions 200 provided in the STI layer 110. The dummy active portions 200 are formed by partially exposing the base material of the semiconductor substrate 10 in the $SiO_2$ film constituting the STI layer 110.

Figure 7:
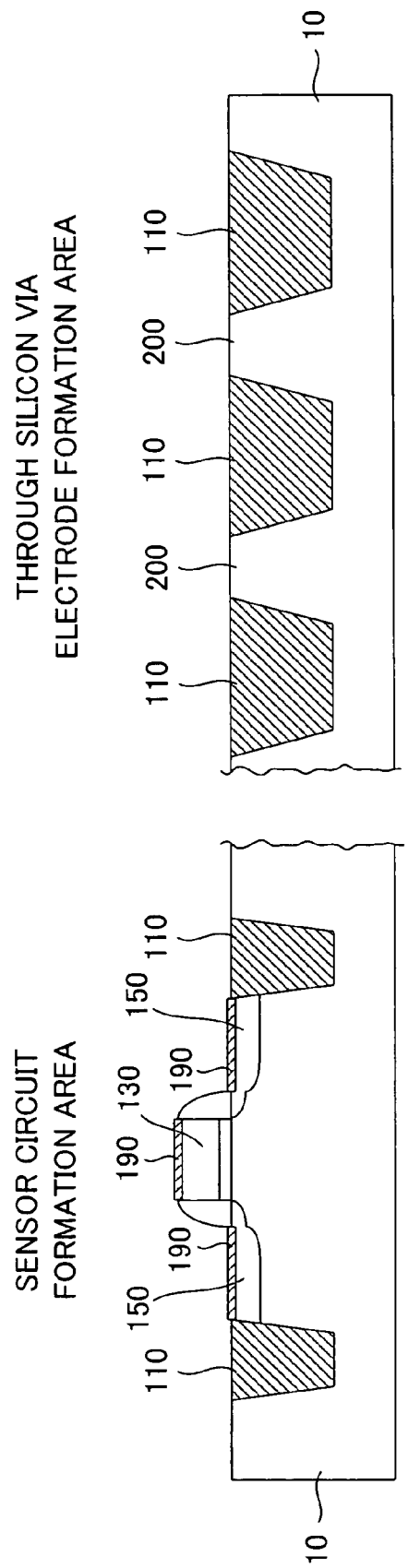
FIG. 7 is a partial cross-sectional view of the image sensor in accordance with an embodiment of the present invention.

FIG. 7 is a partial cross-sectional view of the image sensor of the present embodiment. A cross section of a MOSFET provided in the sensor area "A" is shown at the left side of the figure, and a cross-section of the non-active area "B" in the state before the TSV electrode is formed is shown at the right side of the figure. In the sensor area "A", a silicide layer 190 is formed on the surface of the gate electrode 130 and source-drain diffusion layer 150 of the MOSFET constituting the sensor circuit by applying the salicide technology. By contrast, no silicide layer is formed on the dummy active portions 200 provided in the TSV formation portion. Thus, in the image sensor of the present embodiment, the silicide layer is formed only on the active area in the sensor area "A", rather than over the entire surface of the semiconductor substrate. By not forming the silicide layer on the dummy active portions 200 provided in the non-active area "B" where the TSV electrode should be formed, TSV hole does not intersect with silicide layer in the etching process. Thus, it is possible to prevent the trajectory of etching ions from curving. As a result, the appearance of notches in the side wall of the TSV hole can be prevented.

A method for manufacturing the image sensor of the present embodiment that has the above-described structure will be described below with reference to FIGS. 8A to 8G. FIGS. 8A to 8G are cross-sectional views of each step in the process of manufacturing the image sensor of the present embodiment. These views illustrate the process till the salicide step. A cross section including a MOSFET formation portion (active area) in the sensor area "A" is shown at the left side of each figure, and a cross section including the TSV electrode formation portion in the non-active area "B" is shown at the right side.

Figure 8A:
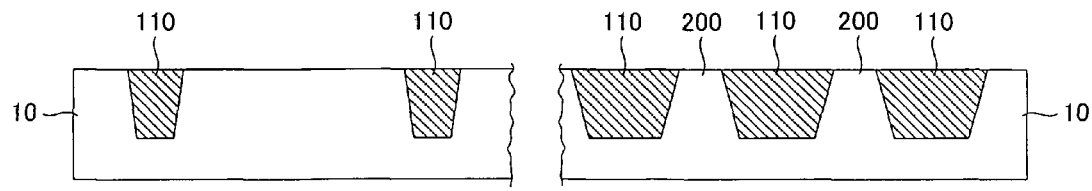
FIGS. 8A to 8G are cross-sectional views illustrating a process of manufacturing the image sensor in accordance with an embodiment of the present invention.

First, the STI layer 110 is formed on the semiconductor substrate 10 composed of single crystal silicon or the like. The STI layer 110 is formed in the sensor area "A" and in the non-active area "B" surrounding the sensor area "A". The STI layer 110 functions as an isolation layer that insulates and separates mutually adjacent active elements from each other in the sensor area "A". In the TSV electrode formation area, the STI layer 110 is formed such that the non-active area "B" dotted with the island-shaped dummy active portions 200. In other words, in the non-active area "B", a portion where the STI layer 110 is not formed and the base material of the semiconductor substrate 10 is exposed is the dummy active portion 200. The STI layer 110 is formed by the below-described process. First, a $SiO_2$ film (not shown in the figure) is formed on the semiconductor substrate 10. Then, $Si_3N_4$ (not shown in the figure) is stacked on the $SiO_2$ film, the films are patterned so as to form a mask that masks a portion except the STI layer formation portion. Then, a trench (not shown in the figure) is formed in the STI layer formation portion by dry etching the semiconductor substrate 10 through the mask. A $SiO_2$ film is then deposited on the semiconductor substrate 10 by a CVD method so as to be embedded in the trench. A portion of the $SiO_2$ film that is located outside the trench is then removed by a CMP method and the surface of the semiconductor substrate 10 is planarized. In this case, because the polishing rate of $Si_3N_4$ film is lower than that of the $SiO_2$ film, the $Si_3N_4$ film acts as a stopper and protects the surface of the semiconductor substrate 10 from damage. The width and formation pitch of the STI layer 110 formed in the sensor area "A" and non-active area "B" may differ from each other (FIG. 8A).

Figure 8B:
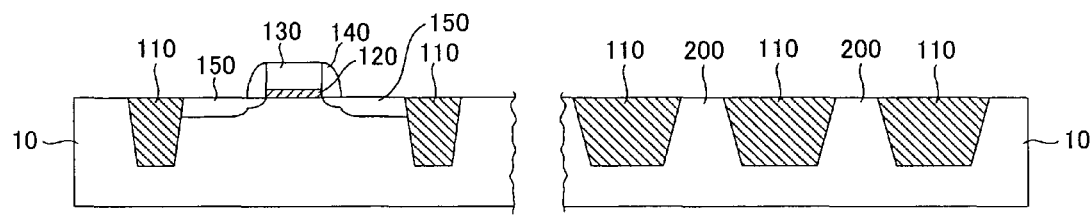

Active elements constituting the sensor circuit such as MOSFET or the like are then formed in the sensor area "A". The MOSFET can be formed using a conventional process. Thus, a gate oxide film 120 composed of $SiO_2$ or the like, a gate electrode 130 composed of polysilicon, and a side wall 140 composed of $SiO_2$ or the like are formed in the order of description and then, for example, phosphorus is ion implanted in the surface of the semiconductor substrate 10 and an n-type source-drain diffusion layer 150 is formed. No active element is formed on the dummy active portions 200 formed in the non-active area "B" (FIG. 8B).

Figure 8C:
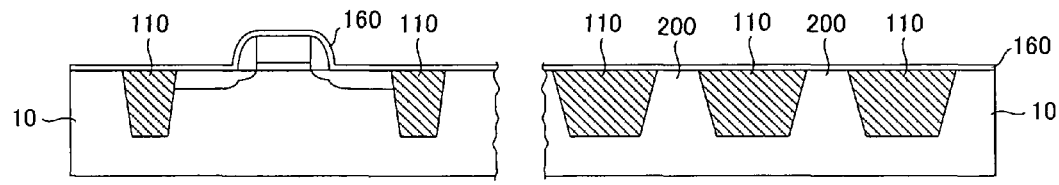
Figure 8D:
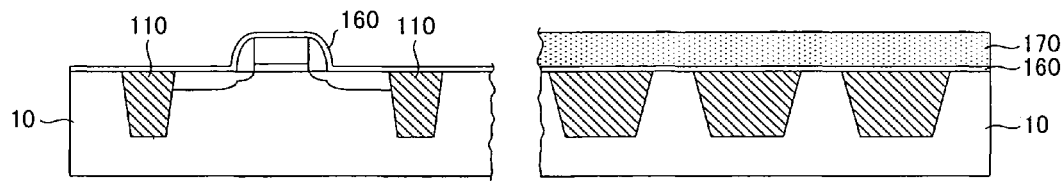
Figure 8E:
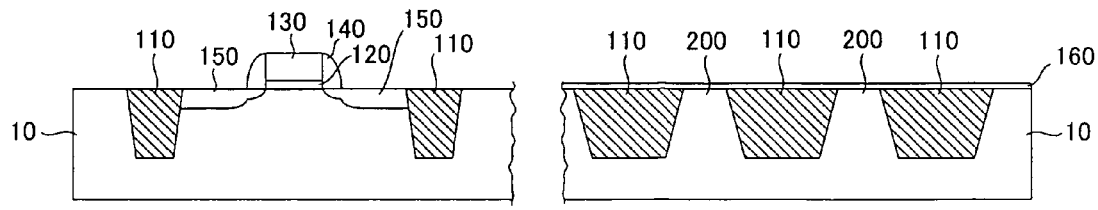

Then, a $SiO_2$ film (silicon oxide film) 160 is deposited over the entire surface of the semiconductor substrate including the sensor area "A" and non-active area "B" by a CVD method using, for example, $SiH_4$ and $O_2$ as reactive gases (FIG. 8C). Then, a resist mask 170 is formed only on the non-active area B (FIG. 8D). Plasma etching using a gas mixture of $CF_4$, Ar, and $O_2$ is then performed through the resist mask 170 to remove only the $SiO_2$ film 160 formed on the sensor area "A" and leave the $SiO_2$ film 160 formed on the non-active area "B" (FIG. 8E). A salicide block is constituted by the $SiO_2$ film 160 formed only on the non-active area "B". The salicide block is a means for preventing the formation of silicide layer applied in the area where silicide layer will not be formed in order to selectively form a silicide layer in the subsequent salicide process.

Figure 8F:
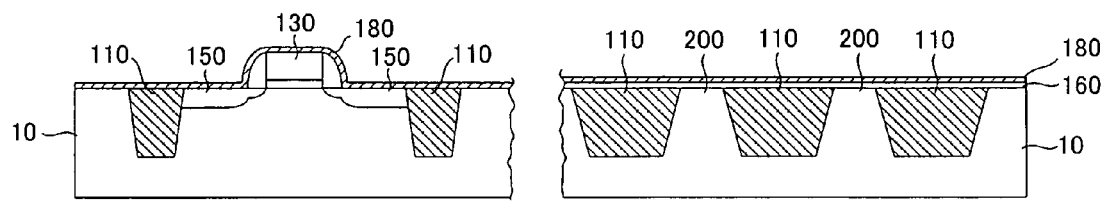

After the salicide block has been formed on the non-active area "B" where the TSV electrodes should be formed, the salicide process is implemented. In the salicide process, for example, Co, TiN, and Ni are successively deposited by a sputtering method or the like on the entire surface of the semiconductor substrate including the sensor area "A" and non-active area "B" and a metal layer 180 is formed (FIG. 8F). Then, an annealing treatment is performed at a comparatively low temperature (for example, 500° C.), Co included in the metal layer 180 is caused to react with Si of the gate electrode 130 and source-drain diffusion layer 150 of the MOSFET, and a metastable silicide layer (CoSi layer) is formed. In this case, in the non-active area "B", the siliciding reaction is not advanced and a silicide layer is not formed on the dummy active portions 200 by the $SiO_2$ film 160 (salicide block) interposed between the dummy active portions 200 and the metal layer 180.

Figure 8G:
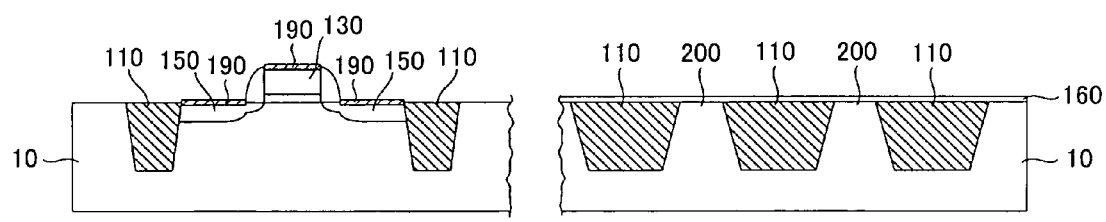

The TiN layer included in the metal layer 180 that has been deposited on the entire surface of the semiconductor substrate is removed by a wet treatment using an ammonium hydroxide–hydrogen peroxide mixture ($NH_4OH+H_2O_2$) prepared by mixing ammonia and aqueous hydrogen peroxide. The unreacted Co film deposited on the salicide block ($SiO_2$ film 160) and the STI layer 110 is then removed by a wet etching using a sulfuric acid hydrogen peroxide mixture ($H_2SO_4+H_2O_2$) prepared by mixing sulfuric acid with aqueous hydrogen peroxide. The second annealing treatment is then performed at a comparatively high temperature (for example, 700° C.), the reaction of the metastable silicide layer (CoSi layer) that has been formed on the gate electrode 130 and source-drain diffusion layer 150 of the MOSFET in the previous process is enhanced, and a stable cobalt silicide layer ($CoSi_2$ layer) 190 is formed (FIG. 8G). Ti and Ni may be also used as a metal material for forming the silicide layer. In this case, the silicide layer to be formed is $TiSi_2$ (titanium silicide) and $NiSi_2$ (nickel silicide), respectively.

After the salicide process has been completed, the conductive wiring 14 and electrode pads 13 are formed in the interlayer insulating film 12 by a conventional multilayer wiring process, and a color filter 15 is provided on the sensor element to complete the formation of a sensor chip. With such a manufacturing method, it is possible to manufacture a sensor chip in which a silicide layer is selectively formed by a salicide block applied in the non-active area "B". Thus, a silicide layer is formed in the MOSFET in the sensor area "A" and the operating speed of the sensor elements can be improved. Meanwhile, no silicide layer is formed on the dummy active portions 200 in the non-active area "B" where the TSV to be formed.

Figure 9A:
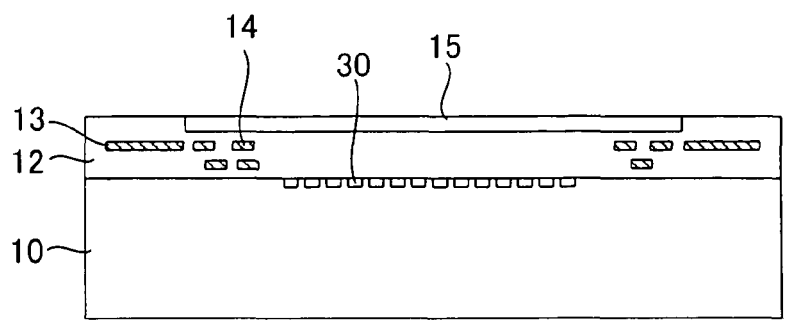
FIGS. 9A to 9G are cross-sectional views illustrating a process of manufacturing the image sensor in accordance with an embodiment of the present invention.

FIGS. 9A to 9G illustrate a process of packaging the sensor chip manufactured by implementing the above-described processes. First, the sensor chip manufactured by implementing the above-described processes is prepared. The sensor chip is provided with a sensor circuit including a plurality of image pick up elements 30 formed on the top surface of the semiconductor substrate 10, interlayer insulating film 12, conductive wiring 14, electrode pads 13, and color filter 15 (FIG. 9A).

Figure 9B:
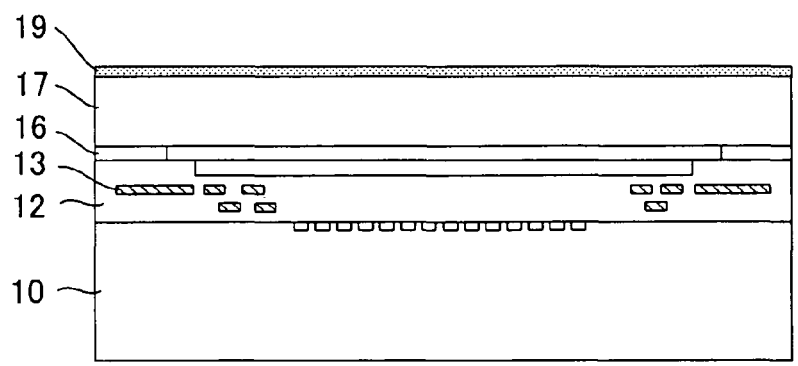
Figure 9C:
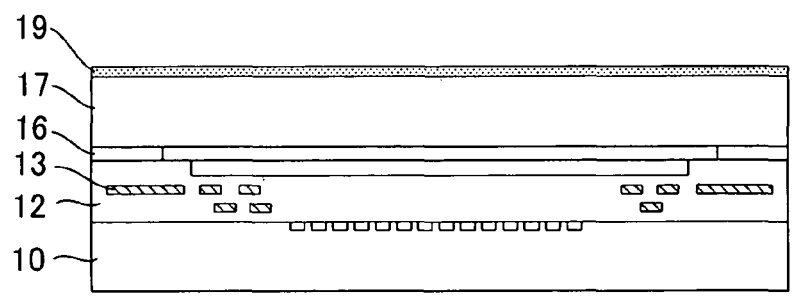

The cover glass 17 having the protective film 19 pasted on the surface thereof is prepared. The protective film 19 is provided to protect the cover glass 17 from damage in the manufacturing process and pasted to cover the entire top surface of the cover glass 17. The cover glass 17 is pasted by the adhesive sheet 16 on the top surface of the semiconductor substrate 10 (FIG. 9B). The reverse surface of the semiconductor substrate 10 is polished to obtain a predetermined thickness of the semiconductor substrate 10 (FIG. 9C).

Figure 9D:
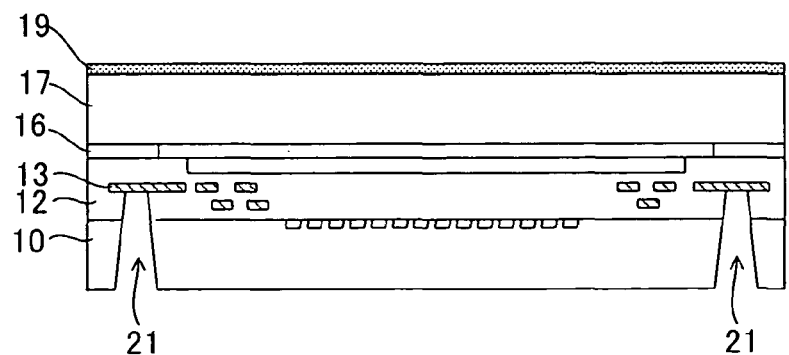

A resist mask (not shown in the figure) having openings at the position corresponding to the TSV electrodes formation portion is formed on the reverse surface of the semiconductor substrate 10. The semiconductor substrate 10 exposed through the openings of the resist mask is etched from the reverse surface side by a dry etching process to form the TSV holes 21 that reach the electrode pads 13 inside the interlayer insulating film 12 are formed (FIG. 9D). The TSV holes 21 are formed so as to pass through the non-active area "B" including a plurality of dummy active portions 200. According to the above-described selective silicide layer formation process, silicide layer is not formed on the dummy active portions 200. Therefore, charging by the etching ions and curving of the etching ion trajectory caused thereby are prevented and the appearance of notches at the side surface of the TSV holes 21 in the etching process is prevented.

Figure 9E:
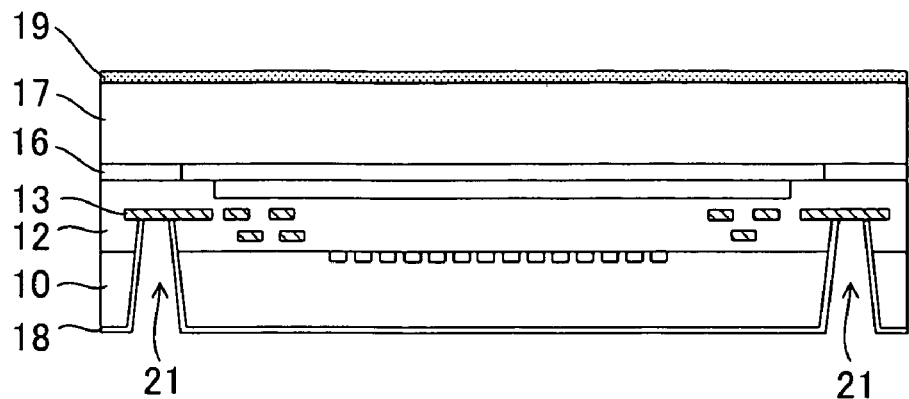

The insulating film 18 composed of SiO$_2$ or the like is then deposited by a CVD method so as to cover the inner wall of each TSV hole 21 and the reverse surface of the semiconductor substrate 10. The insulating film 18 deposited on the bottom surface of each TSV hole 21 is etched to expose the electrode pad 13 at the bottom surface of each TSV hole 21 (FIG. 9E).

Figure 9F:
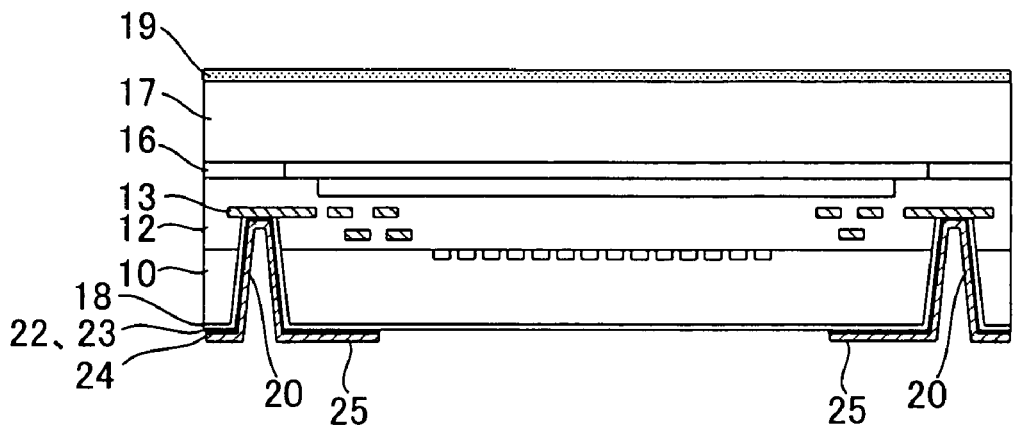

The barrier metal 22 composed of Ti or Ti/Ni and the plating seed film 23 composed of Cu are successively formed on the side wall and bottom surface of each TSV hole 21 and the reverse surface of the semiconductor substrate 10 by a sputtering method. In this case, because notches have not appeared on the side wall of each TSV hole 21, the barrier metal can be deposited without causing a lacking portion. An electrode for electroplating is attached to the plating seed film 23 and the plated film 24 composed of Cu is then deposited on the inner wall of each TSV hole 21 and the reverse surface of the semiconductor substrate 10 by an electroplating method, thereby forming the TSV electrodes 20 and forming the reverse surface wiring 25 on the rear-surface of the semiconductor substrate 10. A resist mask is formed on the reverse surface wiring 25 by using a photosensitive dry film and then etching is performed to form the desired reverse surface wiring pattern. The TSV electrodes 20 are electrically connected to the electrode pads 13 at the bottom surface of the TSV holes 21. The reverse surface wiring 25 is electrically connected to the electrode pads 13 via the TSV electrodes 20 (FIG. 9F).

Figure 9G:
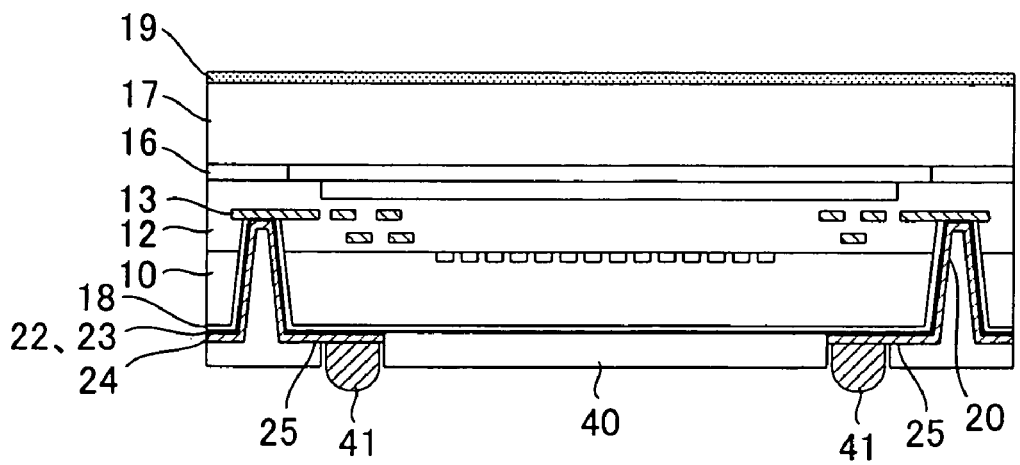

The solder resist 40 composed of a photocurable epoxy resin is then coated so as to cover the entire reverse surface of the semiconductor substrate 10 where the reverse surface wiring 25 has been formed. The solder resist is dehydrated and exposed to photocure through a predetermined photomask. The insides of the TSV holes 21 are filled with the solder resist 40. The unexposed portion of the solder resist 40 is thereafter selectively removed, thereby forming openings at the solder bump formation portions. The solder bumps 41 are formed on the pads of the reverse surface wiring 25 exposed through the openings of the solder resist 40 by electroplating method (FIG. 9G). The protective film 19 attached to the cover glass 17 is then peeled off, the cover glass side is attached to a wafer tape, and the image sensor is diced into chips. The image sensor package is completed by carrying out the steps described above.

As described hereinabove, with the method for manufacturing a semiconductor device in accordance with the present invention that includes a salicide process and a process of forming the TSV electrodes that pass through the non-active area having dummy active portions provided therein, the appearance of notches at the side wall of TSV holes during the formation of the TSV holes that constitute the TSV electrodes can be prevented. Therefore, a barrier metal can be formed on the side wall of each TSV hole without causing a lacking portion, and the diffusion of a contaminant such as Cu that constitutes the plated film into the semiconductor substrate can be reliably prevented.

Figure 10:
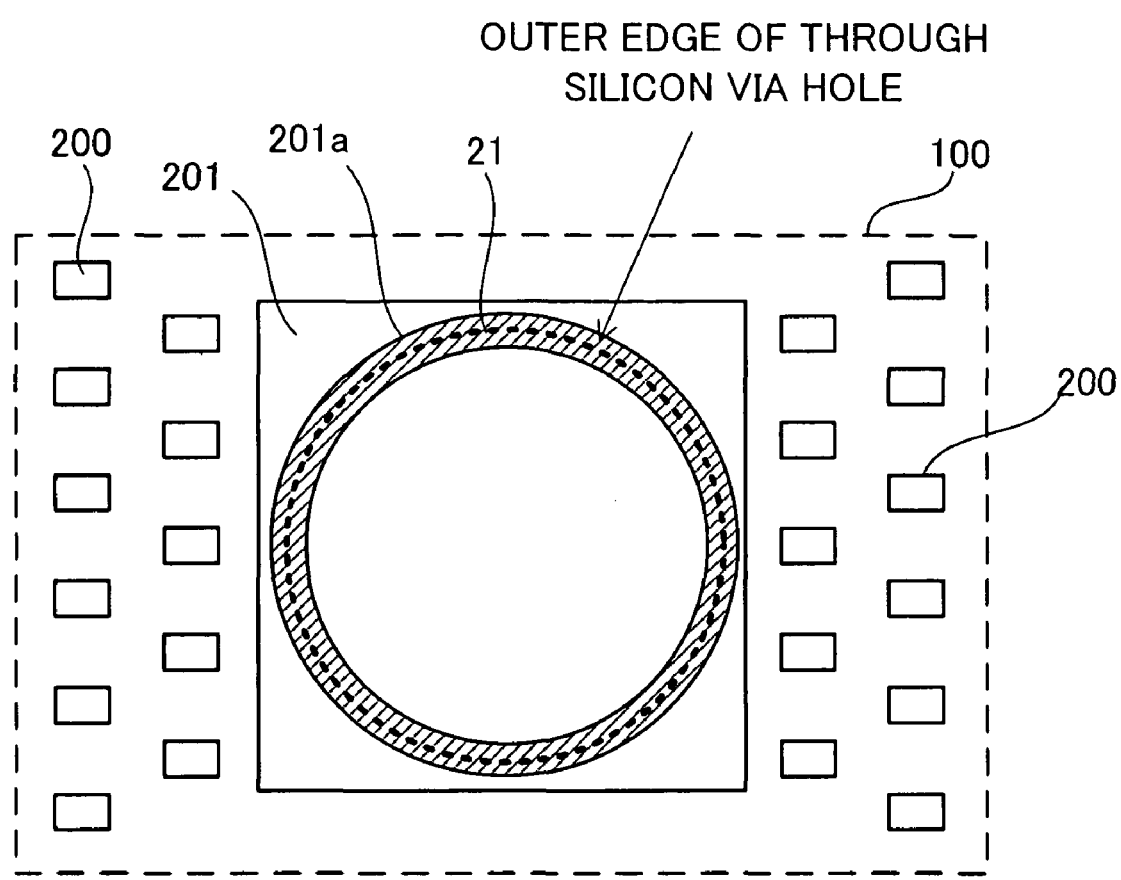
FIG. 10 is a plan view illustrating another surface structure of the semiconductor substrate in the vicinity of the TSV electrode formation portion.

In the above-described embodiment, the semiconductor substrate is divided into the sensor area "A" (first region) and the non-active area "B" (second region) and the salicide block is formed so as to cover all the dummy active portions in the non-active area "B" (second region), thereby preventing the formation of a silicide layer. The appearance of notches also can be prevented, by applying the salicide block so that the silicide layer is not formed at least on a path which the TSV electrodes pass through the semiconductor substrate. In other words, the silicide layer may be formed on the sensor area "A" (first region) and the non-active area "B" (second region) excluding at least a portion in which a TSV electrode should be formed. For example, in a case of a dummy pattern such that one dummy active 201 crosses the entire TSV hole 21, as shown in FIG. 10, salicide blocking may be applied so as to prevent the formation of a silicide layer at least in the region 201a along the outer edge of the TSV hole 21.

The present invention is explained above with reference to the preferred embodiments thereof. It should be understood that a person skilled in the art can conceive of various changes and modifications. All such changes and modifications are assumed to be included in the appended claims.

The disclosure of Japanese Patent Application No. 2009-012586 serving as a basis for the present application is incorporated herein by reference.

What is claimed is:

1. A method for manufacturing a semiconductor device including a semiconductor substrate having a first region that includes a plurality of active elements and a second region that excluding any active element, at least one electrode pad electrically connected to any of said active elements, and at least one Through Silicon VIA electrode electrically connected to said electrode pad by way of said second region, the method comprising the steps of:

forming an insulator layer on a part of said semiconductor substrate to form an isolation layer that insulates and separates said active elements from each other in said first region, and to form at least one dummy portion which is composed of a base material of said semiconductor substrate exposed in said insulator layer in said second region;

forming said active elements in said first region;

forming a silicide layer on said first and second regions excluding at least a portion in which said Through Silicon VIA electrode should be formed;

forming at least one Through Silicon VIA hole extending from a reverse surface side of said semiconductor substrate to said electrode pad by way of said second region; and forming a conductive film on a inner wall of said Through Silicon VIA hole to form said Through Silicon VIA electrode electrically connected to said electrode pad.

2. The method for manufacturing a semiconductor device according to claim 1, wherein the step of forming a silicide layer comprises the steps of:

forming a mask that covers said second region to prevent the formation of said silicide layer on said dummy portion;

forming a metal layer that covers said first and second regions through said mask; and forming said silicide layer on said active elements by reacting said active elements with a metal contained in said metal layer.

3. The method for manufacturing a semiconductor device according to claim 2, wherein said mask is composed of an oxide film.

4. The method for manufacturing a semiconductor device according to claim 3, wherein said active element is a MOSFET, and said silicide layer is formed on a gate electrode and a source-drain diffusion layer of said MOSFET.

5. The method for manufacturing a semiconductor device according to claim 2, wherein said metal layer includes cobalt.

6. The method for manufacturing a semiconductor device according to claim 1, wherein the step of forming a Through Silicon VIA hole comprises a dry etching step.

* * * * *